United States Patent [19]
Lund

[11] Patent Number: 4,767,341
[45] Date of Patent: Aug. 30, 1988

[54] PRINTED CIRCUIT CARD RESET SWITCH

[75] Inventor: Mark D. Lund, Vancouver, Wash.

[73] Assignee: Hewlett-Packard Company, Palo Alto, Calif.

[21] Appl. No.: 121,975

[22] Filed: Nov. 18, 1987

[51] Int. Cl.⁴ .............................................. H01R 9/09
[52] U.S. Cl. ..................................... 439/60; 439/507; 439/629
[58] Field of Search ................. 439/59, 60, 78, 507, 439/509, 510, 513, 629, 630, 636, 637, 924

[56] References Cited
U.S. PATENT DOCUMENTS 3,980,376 9/1976 Rosen .................................. 439/629
4,650,933 3/1987 Benda et al. ........................ 439/60

Primary Examiner—Gil Weidenfeld
Assistant Examiner—Paula A. Austin
Attorney, Agent, or Firm—S. A. Kassatly; Bloor Redding, Jr.

[57] ABSTRACT

A printed circuit card includes a modified finger contact spanning two finger contact positions on its edge connector to momentarily short correspondingly adjacent receptacle contacts of a mating receptacle connector when the printed circuit card is either plugged into or removed from the mating receptacle connector.

2 Claims, 1 Drawing Sheet

PRINTED CIRCUIT CARD RESET SWITCH

BACKGROUND AND SUMMARY OF THE INVENTION

This invention relates generally to printed circuit cards and, more particularly, to printed circuit cards that comprise computer printer and video game cartridges and that include memory chips that serve to configure such microprocessor based printers, video game computers, and other mainframes. For example, many computer printers can accommodate up to twenty or more different character font cartridges while only providing receptacles for two of these font cartridges at any given time. It is therefore frequently necessary to change font cartridges between the printing of documents in order to access different character font sets that allow the user to take advantage of the flexibility in character font selection, etc. that is within the capability of the printer. Ideally, such plug-in cartridges should not be plugged into or removed from the printer or game computer mainframes with which they operate without first removing power to the mainframe. In practice, however, users of mainframes such as printers and game computers oftentimes either inadvertently or intentionally insert or remove cartridges without first turning off power to the mainframe. This typically has the effect of causing a glitch to occur on the memory address and data bus signal lines that couple the cartridge to the mainframe, thereby causing the microprocessor located in the mainframe to be set to an unknown state that may very well interrupt its normal and expected operation. In the worst case, permanent damage may result to electrical components located in either the cartridge or the mainframe.

One prior art solution to this problem has been to implement bus buffers on all signal lines coupling the plug-in cartridge to the mainframe, thus electrically isolating the electrical components located in the plug-in cartridge from the microprocessor located in the mainframe. This solution is disadvantageous in that it is costly, requires additional shielding to accommodate radio frequency interference constraints, and increases the time required for communication between the microprocessor and the plug-in cartridge to take place.

It is therefore the principal object of the present invention to provide a printed circuit card for use in plug-in cartridges of the type that are typically employed in printer and game computer mainframes having provision for automatically generating a reset pulse every time such a cartridge is plugged into or removed from the mainframe with which it operates. Applying such a reset pulse on the microprocessor reset signal line has the effect of setting the microprocessor to a known state just as if operating power to the microprocessor had been removed and then reapplied. This object is accomplished in accordance with the illustrated embodiment of the invention by providing a modified finger contact on an otherwise conventional circuit card so that the modified finger contact momentarily contacts two adjacent contacts within the mating receptacle into which the printed circuit card is plugged, thereby momentarily shorting together those two adjacent contacts. This momentary shorting occurs both when the printed circuit card is being plugged into the mating receptacle and when it is removed therefrom to provide the reset pulse required to set the microprocessor in the mainframe to a known state that is protective of both the proper operation and safety of the microprocessor and other electrical components on the printed circuit card and in the mainframe.

DESCRIPTION OF THE PREFERRED EMBODIMENT

Figure 1:
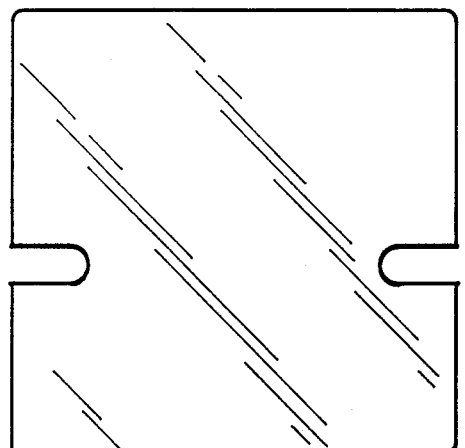
FIG. 1 is a diagram of a representative printed circuit card that includes a modified finger contact in accordance with the present invention.

Referring now to the diagram of FIG. 1, there is shown a printed circuit card 10 of the type having a number of electrical components mounted on a front face thereof and a plurality of circuit traces on both the front and back surfaces thereof that serve to connect the various electrical components to a plurality of finger contacts located at a plurality of finger contact positions on both of said front and back surfaces adjacent a connector edge 12 of circuit card 10. For the sake of simplicity in describing the subject matter that applicant regards as his invention, the electrical components and circuit traces that conventionally fill the front and back surfaces of the printed circuit card 10 are not illustrated. Printed circuit card 10 is adapted to be plugged into a conventional mating printed circuit card receptacle connector 20 that includes a number of receptacle contacts equal to the number of finger contact positions on the printed circuit card 10 so that each of the finger contacts on printed circuit card 10 makes electrical contact with a corresponding one of the receptacle contacts in receptacle connector 20 when printed circuit card 10 is plugged into receptacle connector 20. In accordance with the present invention, a selected one 1 of the plurality of finger contact positions does not contain the same generally elongated single finger contact as is conventionally located at the other finger contact positions of printed circuit card 10. Instead, a finger contact 3 at an immediately adjacent finger contact position to that of finger contact position 1 is formed to have an elongated member 5 extending to the connector edge 12 of circuit card 10 and a connected leg member 7 extending outwardly from elongated member 5 at an end of elongated member 5 that is nearest the connector edge 12 of printed circuit card 10. Leg member 7 extends into the area of finger contact position 1 nearest the connector edge 12 of printed circuit card 10.

Figure 2:
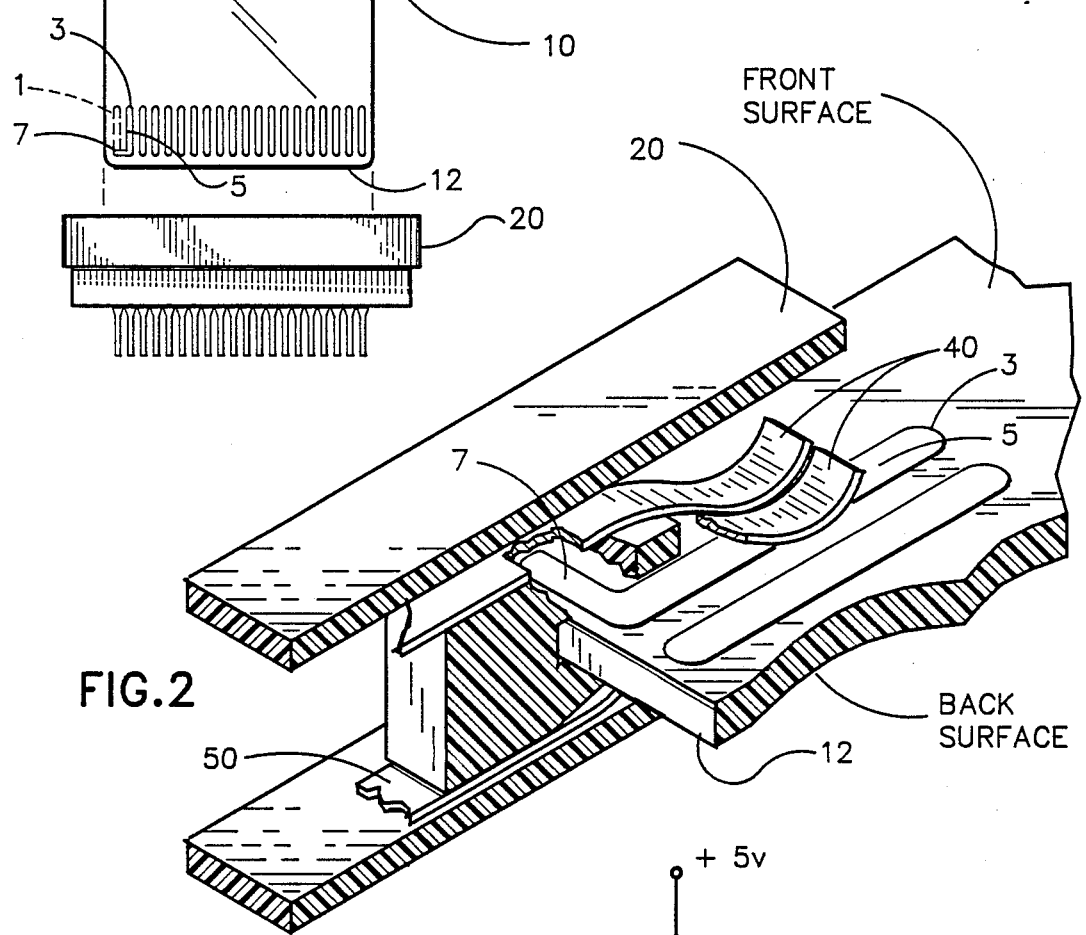
FIG. 2 is a diagram illustrating the way in which a mating receptacle connector receives the printed circuit card of FIG. 1.

Referring now to FIG. 2, there is shown in cross section the receptacle connector 20 of FIG. 1 illustrating one of a plurality of receptacle contacts 40 that serve to make electrical contact with the finger contacts located on the front surface of printed circuit card 10 and a like plurality of receptacle contacts 50 that serve to make electrical contact with the finger contacts located on the back surface of printed circuit card 10. receptacle connector 20, leg member 7 of finger contact 3 will make momentary electrical contact with both the one of receptacle contacts 40 of receptacle connector 20 associated with finger contact 3 of printed circuit card 10 and the adjacent one of receptacle contacts 40 associated with finger contact postion 1, thereby having the effect of momentarily shorting together those two adjacent receptacle contacts. Once the printed circuit card 10 is fully plugged into receptacle connector 20, the leg member 7 of finger contact 3 is no longer in electrical contact with the one of receptacle contacts 40 that is associated with finger contact position 1.

Figure 3:
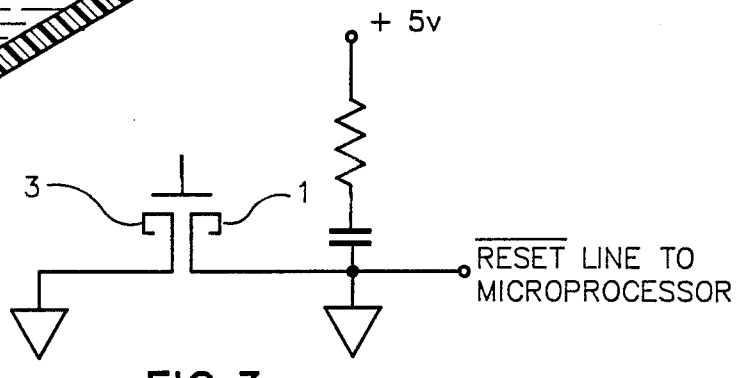
FIG. 3 is an electrical shematic diagram illustrating the way in which a microprocessor reset pulse may be generated by inserting or removing the printed circuit card of FIG. 1 from its mating receptacle connector.

The generation of a reset pulse for use by an external microprocessor by simply plugging the printed circuit card 10 into receptacle connector 20 may be understood electrically with reference to the simplified schematic diagram of FIG. 3. The receptacle connector 20 may, for example, be wired such that the one of receptacle contacts 40 associated with finger contact position 1 of printed circuit card 10 is connected to the reset line of the external microprocessor and such that the adjacent one of receptacle contacts 40 associated with finger contact 3 of printed circuit card 10 is connected to ground. As stated above, as the printed circuit card 10 is plugged into receptacle connector 20, the receptacle contacts associated with finger contact position 1 and finger contact 3 of printed circuit card 10 are momentarily shorted, thereby generating a pulse by momentarily pulling the microprocessor reset line to ground potential.

I claim

1. A printed circuit card of the type having a plurality of electrical components mounted on a face thereof and a plurality of circuit traces on a face thereof that serve to connect various ones of the plurality of electrical components to a plurality of elongated finger contacts at a plurality of finger contact positions adjacent a connector edge of said printed circuit card, the improvement comprising a modified finger contact spanning a selected finger contact position and an immediately adjacent finger contact position, said modified finger contact formed to have an elongated member and having a connected leg member extending outwardly from said elongated member at an end of said elongated member that is nearest said connector edge, said leg member extending into an area defined by said immediately adjacent finger contact position.

2. A printed circuit card for causing a momentary shorting together of two adjacent receptacle contacts within a mating receptacle connector whenever said printed circuit card is plugged into or removed from said mating receptacle connector, the printed circuit card comprising:

edge connector means comprising a plurality of generally parallel elongated finger contacts located at a plurality of finger contact positions adjacent a connector edge of said printed circuit card for separately contacting a corresponding plurality of receptacle contacts within said mating receptacle connector;

a modified finger contact spanning a selected finger contact position and an immediately adjacent finger contact position, said modified finger contact being formed to comprise an elongated member and a connected leg member extending outwardly from said elongated member at an end of said elongated member that is nearest said connector edge of said printed circuit card, said leg member extending into an area defined by said immediately adjacent finger contact position, whereby said leg member momentarily contacts two adjacent receptacle contacts within said mating receptacle connector corresponding to said selected finger contact position and said imediately adjacent finger contact position when said printed circuit card is plugged into or removed from said mating receptacle connector.

* * * * *